United States Patent
Zhang et al.

(10) Patent No.: US 12,170,292 B2
(45) Date of Patent: Dec. 17, 2024

(54) DISPLAY PANEL AND DISPLAY DEVICE

(71) Applicant: Xiamen Tianma Micro-Electronics Co., Ltd., Xiamen (CN)

(72) Inventors: Guofeng Zhang, Xiamen (CN); Yong Yuan, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 465 days.

(21) Appl. No.: 17/517,455

(22) Filed: Nov. 2, 2021

(65) Prior Publication Data

US 2022/0059579 A1 Feb. 24, 2022

(30) Foreign Application Priority Data

May 24, 2021 (CN) .......................... 202110567373.7

(51) Int. Cl.
*H01L 27/12* (2006.01)

(52) U.S. Cl.
CPC ...... *H01L 27/1248* (2013.01); *H01L 27/1225* (2013.01)

(58) Field of Classification Search
CPC . H01L 27/1248; H01L 27/12; H01L 27/1225; H01L 27/1229; H10K 59/1213; H10K 59/121; H10K 59/124
See application file for complete search history.

(56) References Cited

U.S. PATENT DOCUMENTS

| | | | | |
|---|---|---|---|---|
| 10,373,984 | B2* | 8/2019 | Yamaguchi | H01L 29/7869 |
| 11,328,665 | B2* | 5/2022 | Lee | G09G 3/3266 |
| 2018/0286889 | A1* | 10/2018 | Yamaguchi | H01L 27/1225 |
| 2021/0241689 | A1* | 8/2021 | Lee | G09G 3/3233 |

FOREIGN PATENT DOCUMENTS

| | | |
|---|---|---|
| CN | 102856322 A | 1/2013 |
| CN | 202957251 U | 5/2013 |
| CN | 110867459 A | 3/2020 |
| CN | 112768470 A | 5/2021 |

* cited by examiner

*Primary Examiner* — Nikolay K Yushin
(74) *Attorney, Agent, or Firm* — ALSTON & BIRD LLP

(57) ABSTRACT

Provided are a display panel and a display device. The display panel includes a base substrate; a first transistor including a first active layer including silicon, a first gate, a first source and a first drain; a second transistor including a second active layer including an oxide semiconductor, a second gate located on a side of the second active layer facing away from the base substrate, a second source and a second drain; a first insulating layer including an inorganic material; and a planarization layer including an organic material. The first insulating layer includes a first insulating sublayer and a second insulating sublayer. The second insulating sublayer is located on a side of the first insulating sublayer facing away from the base substrate, and a compactness of the second insulating sublayer is greater than a compactness of the first insulating sublayer.

20 Claims, 4 Drawing Sheets

DISPLAY PANEL AND DISPLAY DEVICE

CROSS-REFERENCE TO RELATED APPLICATION(S)

This application claims priority to Chinese Patent Application No. 202110567373.7, titled "DISPLAY PANEL AND DISPLAY DEVICE" filed May 24, 2021, the disclosure of which is incorporated herein by reference in its entirety.

TECHNICAL FIELD

The present disclosure relates to the field of display technologies, and in particular, relates to a display panel and a display device.

BACKGROUND

An organic light-emitting diode (OLED) display panel has been widely applied in the display field for its advantages such as self-illumination, high contrast ratio, small thickness, fast reaction speed and availability for flexible panels.

An OLED element of the OLED display panel is a current-driven element and needs to be provided with a corresponding pixel circuit and a corresponding driving circuit. The driving circuit provides a driving signal for the pixel circuit, so that the pixel circuit provides a driving current for the OLED element to drive the OLED element to emit light. The driving circuit and the pixel circuit in the OLED display panel is each provided with a transistor. A metal oxide semiconductor (such as indium gallium zinc oxide (IGZO)) is usually used as an active layer of the transistor to reduce a leakage current in the transistor. However, an IGZO transistor in the related art has relatively poor stability, thereby affecting the performance of the driving circuit and/or the pixel circuit and affecting the display effect of the display panel.

SUMMARY

Embodiments of the present disclosure provide a display panel and a display device, so as to improve stability of a transistor including an oxide semiconductor, and to ensure good performance of a driving circuit.

In a first aspect, the embodiments of the present disclosure provide a display panel.

The display panel includes a base substrate, a first transistor and a second transistor, a first insulating layer and a planarization layer. The first transistor and the second transistor are formed on the base substrate. The first transistor includes a first active layer, a first gate, a first source and a first drain. The first active layer includes silicon. The second transistor includes a second active layer, a second gate, a second source and a second drain. The second active layer includes an oxide semiconductor, and the second gate is located on a side of the second active layer facing away from the base substrate. The first insulating layer is located on a side of the second gate facing away from the base substrate and includes an inorganic material. The planarization layer is located on a side of the first insulating layer facing away from the base substrate and includes an organic material. The first insulating layer includes a first insulating sublayer and a second insulating sublayer. The second insulating sublayer is located on a side of the first insulating sublayer facing away from the base substrate, and the compactness of the second insulating sublayer is greater than the compactness of the first insulating sublayer.

In a second aspect, the embodiments of the present disclosure further provide a display device including the preceding display panel.

The embodiments of the present disclosure provide a display panel. The display panel includes a base substrate, a first transistor, a second transistor, a first insulating layer and a planarization layer; the first transistor and the second transistor are formed on the base substrate; the first transistor includes a first active layer, a first gate, a first source and a first drain; the first active layer includes silicon; the second transistor includes a second active layer, a second gate, a second source and a second drain; the second active layer includes an oxide semiconductor; the second gate is located on a side of the second active layer facing away from the base substrate; the first insulating layer is located on a side of the second gate facing away from the base substrate and includes an inorganic material; the planarization layer is located on a side of the first insulating layer facing away from the base substrate and includes an organic material; the first insulating layer includes the first insulating sublayer and the second insulating sublayer; the second insulating sublayer is located on a side of the first insulating sublayer facing away from the base substrate, and the compactness of the second insulating sublayer is greater than the compactness of the first insulating sublayer. By providing the first transistor including silicon and the second transistor including an oxide semiconductor and utilizing respective advantages of the silicon-containing transistor and the oxide semiconductor transistor, the performance of an element (such as a pixel circuit or a driving circuit which is composed of transistors) in the display panel can be fully ensured. Moreover, by providing the first insulating layer on a side of the second gate facing away from the base substrate, hydrogen and water-oxygen in the organic material can be blocked from affecting the oxide semiconductor active layer. In addition, by providing the first insulating layer including the first insulating sublayer and the second insulating sublayer, and providing the compactness of the second insulating sublayer greater than the compactness of the first insulating sublayer, the second insulating sublayer with the higher compactness is used for blocking hydrogen and water-oxygen and then the first sub-insulating is used for further protecting the oxide semiconductor active layer so as to fully prevent the oxide semiconductor active layer from being damaged, thereby improving the stability of the second transistor, ensuring the good performance of the driving circuit and enhancing the display effect of the display panel.

DETAILED DESCRIPTION

Figure 1:
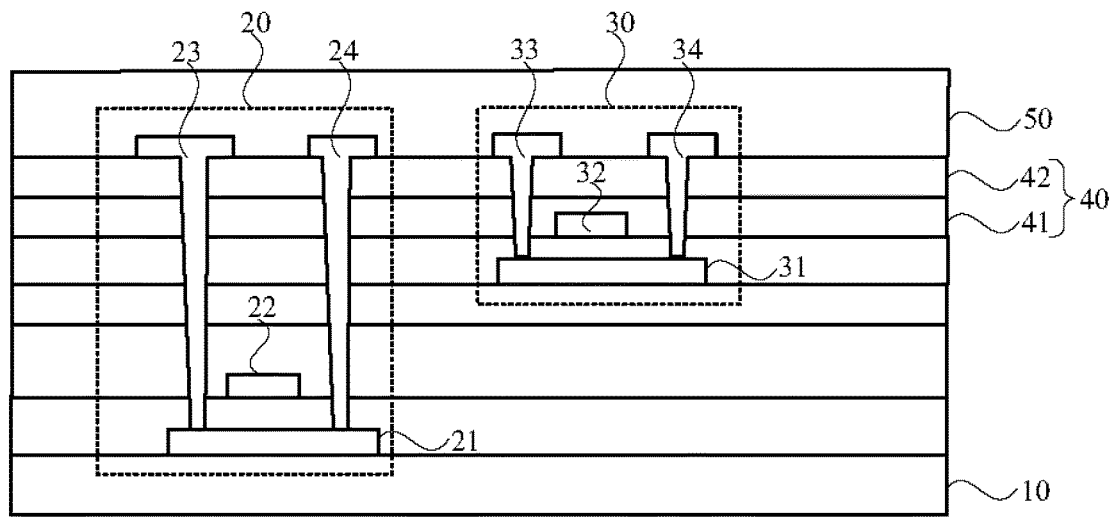
FIG. 1 is a schematic diagram of a display panel according to an embodiment of the present disclosure.

The present disclosure is further described below in detail in conjunction with drawings and embodiments. It is to be understood that the embodiments described herein are merely intended to explain the present disclosure and not to limit the present disclosure. Additionally, it is to be noted that for ease of description, merely part rather than all, of the structures related to the present disclosure are illustrated in the drawings.

Terms used in the embodiments of the present disclosure are merely used to describe embodiments and not intended to limit the present disclosure. It is to be noted that nouns of locality, including "on", "below", "left" and "right", used in the embodiments of the present disclosure are described from the angles shown in the drawings, and are not to be construed as a limitation to the present disclosure. In addition, in the context, it is to be understood that when an element is formed "on" or "below" another element, the element may not only be directly formed "on" or "below" another element, and may also be indirectly formed "on" or "below" another element via an intermediate element. The terms "first", "second" and the like are only used for description and used to distinguish between different components rather than indicate any order, quantity, or importance. For those of ordinary skill in the art, meanings of the preceding terms in the present utility model may be understood based on situations.

FIG. 1 is a schematic diagram of a display panel according to an embodiment of the present disclosure. Referring to FIG. 1, the display panel according to the embodiment of the present disclosure includes a base substrate 10, a first transistor 20, a second transistor 30, a first insulating layer 40 and a planarization layer 50. The first transistor 20 and the second transistor 30 are formed on the base substrate 10. The first transistor 20 includes a first active layer 21, a first gate 22, a first source 23 and a first drain 24. The first active layer 21 includes silicon. The second transistor 30 includes a second active layer 31, a second gate 32, a second source 33 and a second drain 34. The second active layer 31 includes an oxide semiconductor. The second gate 32 is located on a side of the second active layer 31 facing away from the base substrate 10. The first insulating layer 40 is located on a side of the second gate 32 facing away from the base substrate 10 and includes an inorganic material. The planarization layer 50 is disposed on a side of the first insulating layer 40 facing away from the base substrate 10 and includes an organic material. The first insulating layer 40 includes a first insulating sublayer 41 and a second insulating sublayer 42. The second insulating sublayer 42 is located on a side of the first insulating sublayer 41 facing away from the base substrate 10, and the compactness of the second insulating sublayer 42 is greater than the compactness of the first insulating sublayer 41.

The base substrate 10 may be a rigid substrate, such as a glass substrate, or a flexible substrate, such as a polyimide substrate. In practice, this arrangement may be made based on actual situations and is not limited in the embodiments of the present disclosure. The first transistor 20 and the second transistor 30 may be located in a pixel circuit in a display region of the display panel. That is, the pixel circuit includes the first transistor 20 and the second transistor 30. For example, in the pixel circuit, the second transistor 30 may be a driving transistor or a switching transistor. The first transistor 20 and the second transistor 30 may also be transistors in a driving circuit of a non-display region of the display panel. That is, the driving circuit includes the first transistor 20 and the second transistor 30. In the present embodiment, the first transistor 20 and the second transistor 30 each may be a bottom-gate transistor, a top-gate transistor, or a top-bottom-double-gate transistor. In FIG. 1, the first transistor 20 and the second transistor 30 as the top-gate transistors are taken for example. That is, the first gate 22 is located on a side of the first active layer 21 facing away from the base substrate 10, and the second gate 32 is located on a side of the second active layer facing away from the base substrate 10. The first source 23, the first drain 24, the second source 33 and the second drain 34 are all located on a side of the second gate 32 facing away from the base substrate 10 and are disposed to be insulated from the second gate 32. The first source 23, the first drain 24, the second source 33 and the second drain 34 may be disposed on a same layer, which can simplify the process steps. In addition, the first active layer 21 of the first transistor 20 includes silicon. Optionally, the silicon is poly-silicon. That is, the first active layer 21 is a poly-silicon active layer, such as a Low Temperature Poly-Silicon (LTPS) active layer. The second active layer 31 of the second transistor 30 includes an oxide semiconductor. That is, the second active layer 31 is an oxide semiconductor active layer, such as an IGZO active layer. In the following description, all the embodiments are taken the second active layer 31 being the IGZO active layer as an example. An LTPS thin-film transistor has advantages of high carrier mobility, fast response and low power consumption, and an oxide semiconductor thin-film transistor has an advantage of small leakage current, thus when the driving circuit includes the first transistor 20 and the second transistor 30, the driving circuit can have all of the advantages thereof such as high carrier mobility, fast response, low power consumption and small leakage current, thereby ensuring the good performance of the driving circuit and enhancing the display performance of the display panel.

In the structure of the display panel, an array layer is formed by a plurality of first transistors 20, a plurality of second transistors 30, various signal wires, and etc. In order to make the surface of the array layer planarized, the planarization layer 50 including an organic material is disposed on the array layer. Since the organic material forming the planarization layer 50 always contains a large amount of hydrogen and water-oxygen, in order to prevent hydrogen and water-oxygen from affecting the IGZO active layer, in the present embodiment, the first insulating layer 40 is disposed between the planarization layer 50 and the second active layer 31, the first insulating layer 40 includes the first insulating sublayer 41 and the second insulating sublayer 42, and the compactness of the second insulating sublayer 42 is disposed to be greater than the compactness of the first insulating sublayer 41. The first insulating sublayer 41 prevents hydrogen and water-oxygen from entering through its own performance, and the second insulating sublayer 42 prevents hydrogen and water-oxygen through its higher compactness. The second insulating sublayer 42 is located on a side of the first insulating sublayer 41 facing away from the base substrate 10. In this manner, the second insulating sublayer 42 with a higher compactness can be used for blocking hydrogen and water-oxygen firstly and then the first insulating sublayer 41 with a weaker absorbable capacity for water-oxygen and hydrogen can be used for further protecting the IGZO active layer so as to fully prevent the IGZO active layer from being damaged.

In the present embodiment, the so-called compactness refers to an average gap size of gaps between atoms or between molecules of a material. A smaller average gap size of a material indicates a smaller porosity ratio of the material and indicates a higher compactness of the material. A larger average gap size of a material indicates a larger porosity ratio of the material and indicates a smaller compactness of the material. By providing the second insulating sublayer 42 with a greater compactness than the first insulating sublayer 41, hydrogen and water-oxygen can be effectively prevented from affecting the performance of the IGZO active layer.

It is to be noted that a respective insulating layer needs to be provided between the first active layer 21 and the first gate 22, between the first gate 22 and the second active layer 31, between the second active layer 31 and the second gate 32, or between the second gate 32 and the second source 33. The material of the respective insulating layer may be same as the material of the first insulating sublayer 41 or the second insulating sublayer 42. In practice, this arrangement may be made based on actual situations and is not limited in the embodiments of the present disclosure.

In the technical solutions of the embodiment of the present disclosure, by providing the first transistor including silicon and the second transistor including an oxide semiconductor and utilizing respective advantages of the silicon-containing transistor and the oxide semiconductor transistor, the performance of an element (such as a pixel circuit or a driving circuit which is composed of transistors) in the display panel can be fully ensured. Moreover, by providing the first insulating layer on a side of the second gate facing away from the base substrate, hydrogen and water-oxygen in the organic material can be blocked from affecting the oxide semiconductor active layer. In addition, by providing the first insulating layer including the first insulating sublayer and the second insulating sublayer, and providing the compactness of the second insulating sublayer greater than the compactness of the first insulating sublayer, the second insulating sublayer with the higher compactness is used for blocking hydrogen and water-oxygen and then the first sub-insulating is used for further protecting the oxide semiconductor active layer so as to fully prevent the oxide semiconductor active layer from being damaged, thereby improving the stability of the second transistor, ensuring the good performance of the driving circuit and enhancing the display effect of the display panel.

On basis of the preceding embodiments, optionally, the material of the first insulating sublayer 41 includes $SiO_{x1}$, the material of the second insulating sublayer 42 includes $SiN_{y11}$. x1 denotes the ratio of the number of oxygen atoms in the first insulating sublayer 41 to the number of silicon atoms in the first insulating sublayer 41, y11 denotes the ratio of the number of nitrogen atoms in the second insulating sublayer 42 to the number of silicon atoms in the second insulating sublayer 42, and x1>y11.

The first insulating sublayer 41 includes silicon oxide $SiO_{x1}$, and the second insulating sublayer 42 includes $SiN_{y11}$. The first insulating sublayer 41 is close to the second gate 32, and is closer to the IGZO active layer. As $SiO_{x1}$ has a better effect of blocking hydrogen elements, the first insulating sublayer 41 is disposed to fully protect the IGZO active layer from being disturbed by hydrogen elements in an organic layer such as the planarization layer 50. Moreover, the first insulating sublayer 41 is adjacent to the IGZO active layer, which may supplement oxygen elements for the IGZO active layer, thereby ensuring the normal function of the IGZO active layer. Silicon nitride generally has a higher compactness, due to that a structure of a crystalline cell of crystalline silicon nitride is a regular octahedra with Si at a top, Si at a bottom and Si at a center and N at four top corners in a middle plane. The structure of the crystalline cell is:

A structure of the crystalline cell of crystalline silicon oxide is a regular tetrahedron, with Si in a center and oxygen at four corners. The structure of silicon oxide $SiO_{x1}$ composed of a plurality of crystalline cells connected to each other is:

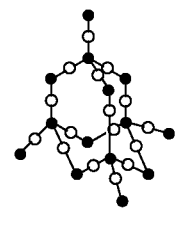

● Si
○ O

Such a connection mode causes the silicon oxide with a lattice compactness lower than the silicon nitride, resulting in the compactness of the silicon oxide lower than the compactness of the silicon nitride. In addition, a content of hydrogen in silicon oxide is less than a content of hydrogen in silicon nitride. In summary, by providing the material of the first insulating sublayer including $SiO_{x1}$, and the material of the second insulating sublayer including $SiN_{y11}$, and by providing x1>y11 (as studies have found that when the content of silicon atoms in silicon nitride or silicon oxide is higher, a lattice is conducive to be formed by capturing free oxygen or free nitrogen, thus it is more conducive for crystallization of silicon nitride or silicon oxide to form a lattice), the second insulating sublayer has a higher content of silicon atoms so as to improve the compactness of the second insulating sublayer.

In the present embodiment, $SiO_{x1}$ may be a silicon oxide crystal with an ordered long-range or silicon oxide crystal with an ordered short-range or with a disordered long-range; and $SiN_{y11}$ may be may be a silicon nitride crystal with an ordered long-range or silicon nitride crystal with an ordered short-range or with a disordered long-range, which are not limited in the embodiments of the present disclosure.

Optionally, the material of the first insulating sublayer 41 includes $SiO_{x1}$, the material of the second insulating sublayer 42 includes $SiO_{x12}N_{y12}$, x1 denotes the ratio of the number of oxygen atoms in the first insulating sublayer 41 to the number of silicon atoms in the first insulating sublayer 41, x12 denotes the ratio of the number of oxygen atoms in the second insulating sublayer 42 to the number of silicon atoms in the second insulating sublayer 42, y12 denotes the ratio of the number of nitrogen atoms in the second insulating sublayer 42 to the number of silicon atoms in the second insulating sublayer 42, and x1>x12+y12.

In another embodiment, the second insulating sublayer 42 also may be $SiO_{x12}N_{y12}$. Studies show that if oxygen atoms are inserted into a lattice of silicon nitride, the lattice compactness of silicon nitride can be further improved and thus the compactness of silicon nitride is further improved. Thus, in the present embodiment, the material of the second insulating sublayer is $SiO_{x12}N_{y12}$, and the second insulating sublayer with a higher compactness is formed by oxygen atoms being permeated into the lattice of silicon nitride. In addition, in order to fully improve the compactness of silicon nitride, the content of nitrogen in $SiO_{x12}N_{y12}$ is improved, which makes x1>x12+y12, thereby ensuring the compactness of the second insulating sublayer 42 greater than the compactness of the first insulating sublayer 41, and blocking hydrogen and water-oxygen.

Optionally, the first insulating sublayer 4 contacts the second insulating sublayer 42. The concentration of oxygen atoms on a side of the second insulating sublayer 42 facing the first insulating sublayer 41 is greater than the concentration of oxygen atoms on a side of the second insulating sublayer 42 facing away from the first insulating sublayer 41.

It is to be understood, in practice, the first insulating sublayer 41 may be disposed adjacent to the second insulating sublayer 42, or, other insulating sublayers may be disposed between the first insulating sublayer 41 and the second insulating sublayer 42. In practice, this arrangement may be made based on actual situations. In the present embodiment, as shown in FIG. 1, the first insulating sublayer 41 is disposed to contact the second insulating sublayer 42. When the first insulating sublayer 41 and the second insulating sublayer 42 contact each other, oxygen atoms in the first insulating sublayer diffuse over time. In practice, by providing the concentration of oxygen atoms on a side of the second insulating sublayer 42 facing the first insulating sublayer 41 to be greater than the concentration of oxygen atoms on a side of the second insulating sublayer 42 facing away from the first insulating sublayer 41, the content difference of oxygen on a contact surface between the second insulating sublayer containing $SiO_{x12}N_{y12}$ and the first insulating sublayer containing $SiO_{x1}$ can be minimized. According to Fick's first law, a flow rate of diffused substance passing through a unit cross-sectional area perpendicular to a diffusion direction in unit time (i.e., a diffusion flux) is proportional to a concentration gradient of the unit cross-sectional area. That is, the greater the concentration gradient is, the larger the diffusion flux is. Thus, the diffusion of oxygen atoms can be reduced by the concentration gradient on the interface between the first insulating sublayer and the second insulating sublayer being reduced. Since a proper amount of oxygen atoms diffuses into $SiO_{x12}N_{y12}$, oxygen atoms can be permeated into the lattice of silicon oxide, which is conducive to improve the compactness of the second insulating sublayer. However, if excessive oxygen atoms diffuse into $SiO_{x12}N_{y12}$, a structure of silicon oxide may be formed. As discussed in the preceding, the compactness of a structure of the silicon oxide structure is less than the compactness of the silicon nitride structure. Thus, in the present embodiment, a higher concentration of oxygen atoms is disposed at partial region of the contact surface between the second insulating sublayer containing $SiO_{x12}N_{y12}$ and the first insulating sublayer containing $SiO_{x1}$, so that the concentration gradient of the two insulating layers can be reduced and a higher compactness of the second insulating sublayer can be ensured at the same time.

In another embodiment, the second insulating sublayer may not be an inorganic substance including silicon but may be a metal oxide layer (such as aluminum oxide, AlO, and zirconia, ZrO) that can form a compact film-layer. Optionally, the material of the first insulating sublayer 41 includes $SiO_{x1}$, the material of the second insulating sublayer 42 includes $MO_{a11}$. x1 denotes a ratio of the number of oxygen atoms in the first insulating sublayer 41 to the number of silicon atoms in the first insulating sublayer 41, a11 denotes a ratio of the number of oxygen atoms in the second insulating sublayer 42 to the number of M atoms in the second insulating sublayer 42, and M is one of Al, Zr, Ti, Ta, Y, Nb, Mg or Ce.

A film-layer such as an ALO layer or a ZrO layer can be prepared through atomic deposition (ALD), having a rather high compactness and enabling to effectively block hydrogen and water-oxygen. Silicon oxide can be formed through physical vapor deposition (CVD). That is, the first insulating sublayer 41 including $SiO_{x1}$ and the second insulating sublayer 42 including $MO_a$ii are formed through CVD and ALD respectively, and M is one of Al, Zr, Ti, Ta, Y, Nb, Mg or Ce. Thus, an insulating layer for effectively blocking hydrogen and water-oxygen can be formed so as to avoid the failure of the IGZO active layer.

Figure 2:
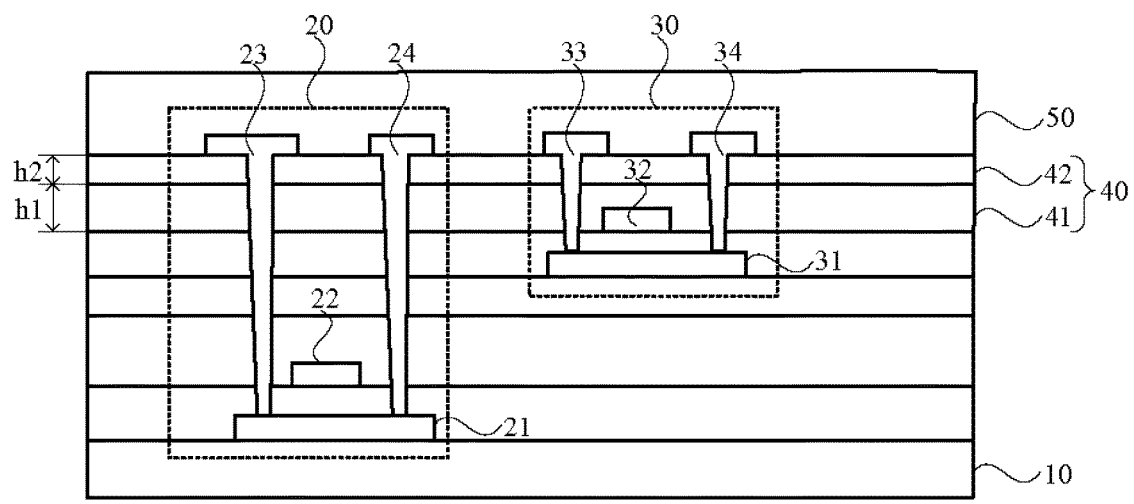
FIG. 2 is a schematic diagram of a display panel according to another embodiment of the present disclosure.

FIG. 2 is a schematic diagram of a display panel according to another embodiment of the present disclosure. Referring to FIG. 2, optionally, the thickness h1 of the first insulating sublayer 41 is greater than the thickness h2 of the second insulating sublayer 42.

The second insulating sublayer 42 has a higher compactness, and the thickness of the second insulating sublayer 42 is controlled by its compactness. When the thickness of the second insulating sublayer 42 reaches to a certain extent, its thickness makes less contribution than its compactness. Thus, the thickness of the first insulating sublayer 41 is disposed to be greater than the thickness of the second insulating sublayer 42, so that the material of a film layer with a higher compactness can be saved. Generally speaking, a thickness of a film layer with a higher compactness is smaller than 30 nm.

Figure 3:
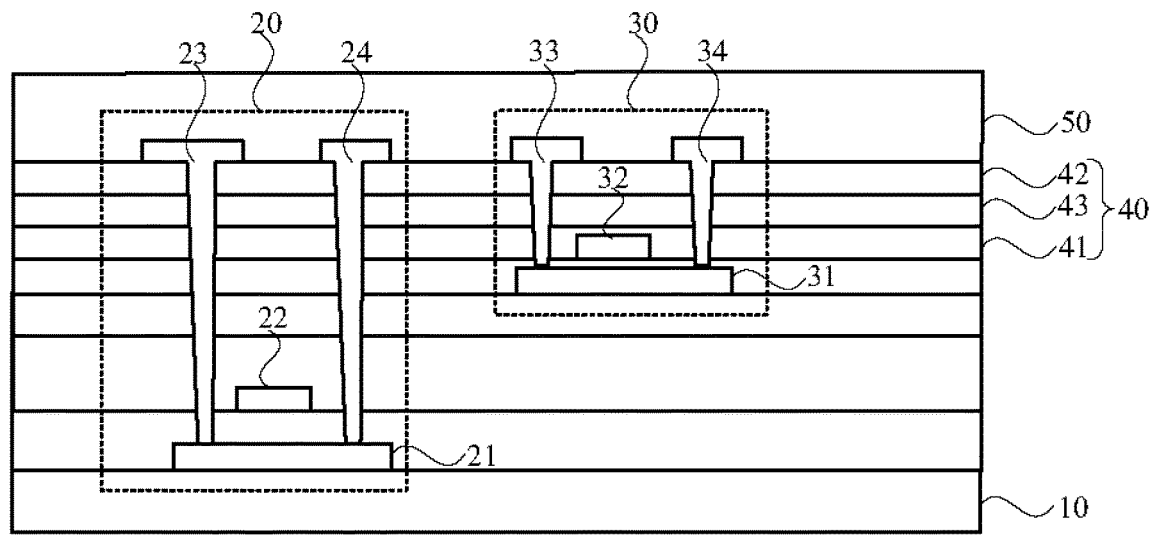
FIG. 3 is a schematic diagram of a display panel according to another embodiment of the present disclosure.

FIG. 3 is a schematic diagram of a display panel according to another embodiment of the present embodiment. Referring to FIG. 3, optionally, the display panel further includes a third insulating sublayer 43. The third insulating sublayer 43 is located on a side of the first insulating sublayer 41 facing away from the base substrate 10 and the compactness of the third insulating sublayer 43 is greater than the compactness of the first insulating sublayer 41, and is greater than the compactness of the second insulating sublayer 42.

The third insulating sublayer 43 may be disposed on a side of the second insulating sublayer 42 facing away from the first insulating sublayer 41 or also may be disposed between the first insulating sublayer 41 and the second insulating sublayer 42. By way of example, referring to FIG. 3, in the present embodiment, optionally, the third insulating sublayer 43 is located between the first insulating sublayer 41 and the second insulating sublayer 42. The third insulating sublayer 43 with a higher compactness is disposed, so that the second insulating sublayer 42 is located on a side of the third insulating sublayer 43 facing the planarization layer 50. The second insulating sublayer 42 plays a role in buffering and blocking hydrogen and water-oxygen and then the third insulating sublayer 43 with a higher compactness is used for fully blocking hydrogen and water-oxygen. In this manner, hydrogen and water-oxygen can be better blocked and the stability of the second transistor can be improved.

It is to be noted that in other embodiments, the first insulating layer may be provided with a more insulating sublayers, such as at least two groups of first insulating sublayer and second insulating sublayer repeatedly stacked or at least two groups of first insulating sublayer, second insulating sublayer and third insulating sublayer repeatedly stacked. In another embodiment, the first insulating sublayer, the third insulating sublayer and the first insulating sublayer may be stacked in sequence, or, the first insulating sublayer, the third insulating sublayer, the second insulating sublayer, the first insulating sublayer and the second insulating sublayer may be stacked in sequence, so as to enhance the blocking effect to hydrogen, water-oxygen. In practice, this arrangement may be made based on actual situations.

Optionally, the material of the first insulating sublayer 41 includes $SiO_{x1}$, the material of the second insulating sublayer 42 includes $SiN_{y21}$, the material of the third insulating sublayer 43 includes $SiO_{x22}N_{y22}$, x1 denotes the ratio of the number of oxygen atoms in the first insulating sublayer 41 to the number of silicon atoms in the first insulating sublayer 41, y21 denotes the ratio of the number of nitrogen atoms in the second insulating sublayer 42 to the number of silicon atoms in the second insulating sublayer 42, x22 denotes the ratio of the number of oxygen atoms in the third insulating sublayer 43 to the number of silicon atoms in the third insulating sublayer 43, y22 denotes the ratio of the number of nitrogen atoms in the third insulating sublayer 43 to the number of silicon atoms in the third insulating sublayer 43, and at least one of x1>x22+y22 and x22+y22≥y21 is satisfied.

In the present embodiment, the first insulating layer 40 includes a three-layer structure of silicon oxide (the first insulating sublayer 41), silicon oxynitride (the third insulating sublayer 43) and silicon nitride (the second insulating sublayer 42). Silicon oxynitride has a highest compactness, followed by silicon nitride and silicon oxide in sequence. Silicon nitride has a highest storage capacity for hydrogen, followed by silicon oxynitride and silicon oxide in sequence. By setting X1>x22+y22, the content of silicon in silicon oxynitride is greater than the content of silicon in silicon oxide so as to ensure a higher compactness of silicon oxynitride. By setting X22+y22≥y21, the content of silicon in silicon nitride can be further improved on the premise of silicon oxynitride being introduced to improve the, so as to ensure the compactness of silicon nitride.

In another embodiment, the third insulating sublayer may not be an inorganic substance including silicon but may be a metal oxide layer (such as AlO and ZrO) that can form a compact layer. Optionally, the material of the first insulating sublayer 41 includes $SiO_{x1}$, the material of the second insulating sublayer 42 includes $SiN_{y11}$, the material of the third insulating sublayer 43 includes $MO_{a21}$, and M is one of Al, Zr, Ti, Ta, Y, Nb, Mg or Ce.

A film layer such as An AlO layer or a ZrO layer can be prepared through ALD, having a rather high compactness and enabling to effectively block hydrogen and water-oxygen. Silicon oxide and silicon oxynitride may be formed through CVD. That is, the first insulating sublayer 41 including $SiO_{x1}$ and the second insulating sublayer 42 including $SiN_{y21}$ are formed through CVD, and the third insulating sublayer 43 including $MO_{a21}$ is formed through ALD. M is one of Al, Zr, Ti, Ta, Y, Nb, Mg or Ce. Thus, an insulating layer for effectively blocking hydrogen and water-oxygen can be formed, so as to avoid the failure of the IGZO active layer.

Figure 4:
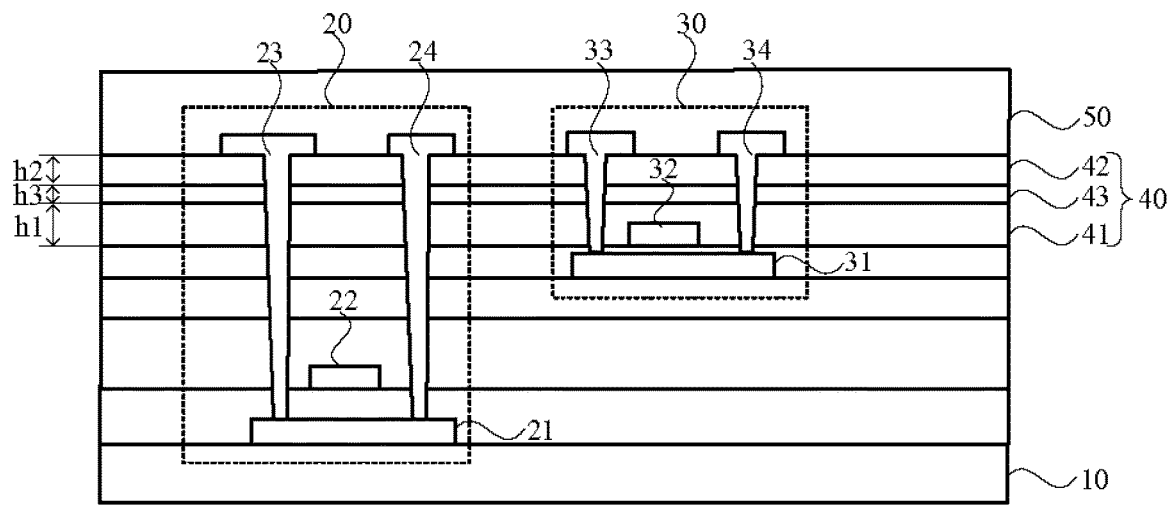
FIG. 4 is a schematic diagram of a display panel according to another embodiment of the present disclosure.

FIG. 4 is a schematic diagram of a display panel according to another embodiment of the present disclosure. Referring to FIG. 4, optionally, the thickness h3 of the third insulating sublayer 43 is smaller than the thickness h1 of the first insulating sublayer 41 and the thickness h2 of the second insulating sublayer 42.

Since the compactness of the third insulating sublayer plays a more important role, when the thickness of the third insulating layer reaches to a certain extent, the thickness of the third insulating sublayer makes less contribution. Thus, the third insulating layer would not need to be too thick. The thickness of the third insulating sublayer is the smallest and is generally below 30 nm to save material.

Figure 5:
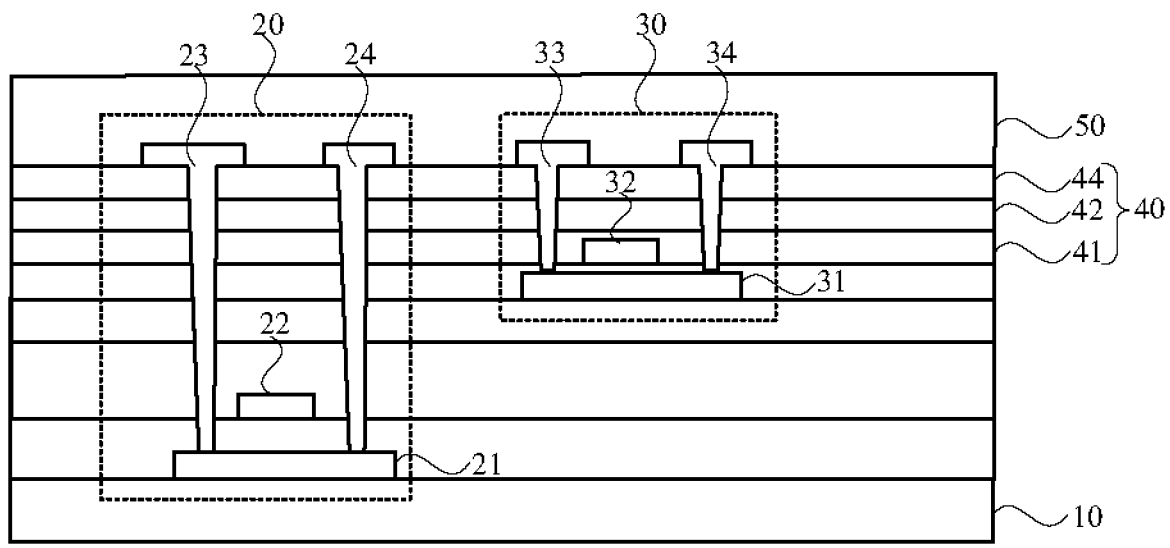
FIG. 5 is a schematic diagram of a display panel according to another embodiment of the present disclosure.

FIG. 5 is a schematic diagram of a display panel according to another embodiment of the present disclosure. Referring to FIG. 5, optionally, the display panel further includes a fourth insulating sublayer 44 that is located on a side of the second insulating sublayer 42 facing away from the base substrate 10. The fourth insulating sublayer 44 includes a same type of material as at least one of the first insulating sublayer 41 or the second insulating sublayer 42.

In the present embodiment, the same type of material means that the above insulating sublayers all belong to silicon oxide or silicon nitride or silicon oxynitride or metal oxide (e.g., aluminum oxide). In a special case, the atomic ratio of elements in the same type of material is required to be the same. However, in other embodiments, on the premise that the material type is not altered, the atomic ratio may be adjusted properly. All of the above belong to the scope of the same type of material. It is to be noted that in a case where silicon nitride is altered into silicon oxide in which a small amount of nitrogen impurities still exists, this case does not belong to the scope of the same type of material.

In the present embodiment, the first insulating layer 40 uses a structure in which a plurality of sub-layers are stacked. The fourth insulating sublayer 44 may be of the same material as the first insulating sublayer 41 or the second insulating sublayer 42. In other embodiments, a plurality of fourth insulating sublayers are included, for example, to form a stacked structure of a plurality of groups of silicon oxide and silicon nitride, facilitating repeatedly blocking hydrogen and water-oxygen through the plurality of film layers so as to protect the IGZO active layer.

Optionally, of the first insulating sublayer 41 and the second insulating sublayer 42, one insulating sublayer including the same type of material as the fourth insulating sublayer 44 and having a same atomic ratio as the fourth insulating sublayer 44 is not in contact with the fourth insulating sublayer 44. Of the first insulating sublayer 41 and the second insulating sublayer 42, one insulating layer including the same type of material as the fourth insulating sublayer 44 and having a different atomic ratio from the fourth insulating sublayer 44 is in contact with the fourth insulating sublayer 44 or is separated from the fourth insulating sublayer 44 by another layer.

Two insulating sublayers include the same type of material, which only indicates that they are both made of silicon nitride or are both made of silicon oxide. The two insulating sublayers may have same atomic ratio or different atomic ratios. When having different atomic ratios, the two insulating sublayers may contact each other or another layer may be disposed between the two insulating sublayers. When having the same atomic ratio, the two insulating sublayers contacting each other may be treated as a same layer. Thus, when having the same atomic ratio, the two insulating sublayers do not contact each other, and another layer needs to be disposed between the two insulating sublayers. Here "another layer needs to be disposed between the two insulating sublayers" refers to that at least one layer is disposed therebetween.

Optionally, the material of the first insulating sublayer 41 includes $SiO_{x1}$, the material of the fourth insulating sublayer 44 includes $SiO_{x14}$, x1 denotes the ratio of the number of oxygen atoms in the first insulating sublayer 41 to the number of silicon atoms in the first insulating sublayer 41, x14 denotes the ratio of the number of oxygen atoms in the fourth insulating sublayer 44 to the number of silicon atoms in the fourth insulating sublayer 44, and x1≥x14.

When the material of the first insulating sublayer 41 includes $SiO_{x1}$, and the material of the fourth insulating sublayer 44 includes $SiO_{x14}$, which namely means that the first insulating layer 40 includes two layers of silicon nitride. By setting x1≥x14, the first insulating sublayer 41 has more oxygen, that is because the first insulating sublayer 41 is relatively close to the IGZO active layer, however the IGZO active layer is a metal oxide, and the IGZO active layer needs to maintain an oxygen-rich environment. Thus, as the concentration of oxygen in the first insulating sublayer 41 is higher, the first insulating sublayer 41 can keep more oxygen content while blocking hydrogen elements, so as to fully ensure the performance of the IGZO active layer.

Optionally, the material of the first insulating sublayer 41 includes $SiO_{x1}$, the material of the second insulating sublayer 42 includes $SiN_{y11}$, the material of the fourth insulating sublayer 44 includes $SiN_{y14}$, x1 denotes the ratio of the number of oxygen atoms in the first insulating sublayer 41 to the number of silicon atoms in the first insulating sublayer 41, y11 denotes the ratio of the number of nitrogen atoms in the second insulating sublayer 42 to the number of silicon atoms in the second insulating sublayer 42, y14 denotes the ratio of the number of nitrogen atoms in the fourth insulating sublayer 44 to the number of silicon atoms in the fourth insulating sublayer 44, and y11≤y14.

When the material of the first insulating sublayer 41 includes $SiO_{x1}$, the material of the second insulating sublayer 42 includes $SiN_{y11}$, and the material of the fourth insulating sublayer 44 includes $SiN_{y14}$, which namely means that the first insulating layer 40 includes two layers of silicon nitride. By setting y11≤y14, the compactness of the second insulating sublayer 42 is higher. Similar to the embodiment in FIG. 3, the fourth insulating sublayer 44 (similar to the second insulating sublayer 42 in FIG. 3) plays a buffering role first and then the second insulating sublayer 42 (similar to the third insulating sublayer 43 in FIG. 3) plays a blocking role so as to fully protect the IGZO active layer.

Optionally, the material of the first insulating sublayer 41 includes $SiO_{x1}$, the material of the second insulating sublayer 42 includes $SiO_{x12}N_{y12}$, the material of the fourth insulating sublayer 44 includes $SiO_{x24}N_{y24}$, x1 denotes the ratio of the number of oxygen atoms in the first insulating sublayer 41 to the number of silicon atoms in the first insulating sublayer 41, x12 denotes the ratio of the number of oxygen atoms in the second insulating sublayer 42 to the number of silicon atoms in the second insulating sublayer 42, y12 denotes the ratio of the number of nitrogen atoms in the second insulating sublayer 42 to the number of silicon atoms in the second insulating sublayer 42, x24 denotes the ratio of the number of oxygen atoms in the fourth insulating sublayer 44 to the number of silicon atoms in the fourth insulating sublayer 44, y24 denotes the ratio of the number of nitrogen atoms in the fourth insulating sublayer to the number of silicon atoms in the fourth insulating sublayer 44, and x12≥x24.

When the material of the first insulating sublayer 41 includes $SiO_{x1}$, the material of the second insulating sublayer 42 includes $SiO_{x12}N_{y12}$, and the material of the fourth insulating sublayer 44 includes $SiO_{x24}N_{y24}$, which namely means that the first insulating layer 40 includes two layers of silicon oxynitride. By setting x12≥x24, the second insulating sublayer 42 has more oxygen that can fill more silicon oxide space, so as to make the second insulating sublayer 42 have a higher compactness. Optionally, by setting y12≤y24, the compactness of the second insulating sublayer 42 is much higher.

In another embodiment, at least two insulating sublayers including metal oxide layers (such as AlO and ZrO) with compact film layers may also be disposed. Optionally, the material of the first insulating sublayer 41 includes $SiO_{x1}$, the material of the second insulating sublayer 42 includes $MO_{a11}$, the material of the fourth insulating sublayer 44 includes $MO_{a12}$, x1 denotes the ratio of the number of oxygen atoms in the first insulating sublayer 41 to the number of silicon atoms in the first insulating sublayer 41, a11 denotes the ratio of the number of oxygen atoms in the second insulating sublayer 42 to the number of M atoms in the second insulating sublayer 42, a12 denotes the ratio of the number of oxygen atoms in the fourth insulating sublayer 44 to the number of M atoms in the fourth insulating sublayer 44, M is one of Al, Zr, Ti, Ta, Y, Nb, Mg or Ce, and a11≥a12, so as to fully protect the IGZO active layer.

Figure 6:
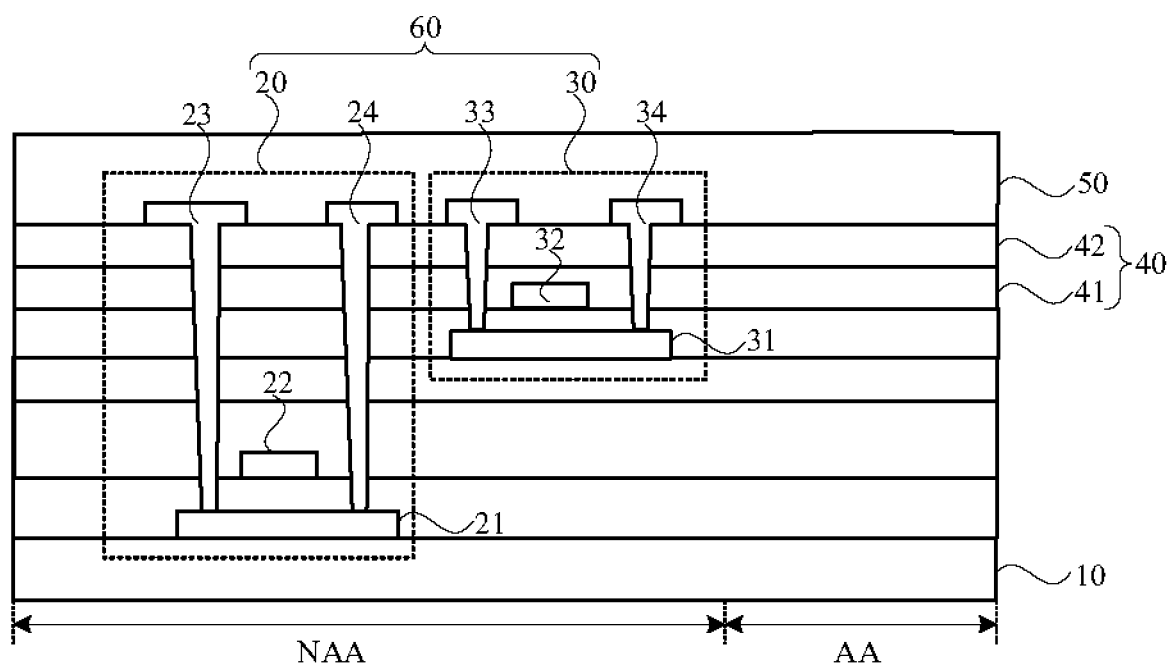
FIG. 6 is a schematic diagram of a display panel according to another embodiment of the present disclosure.

It is to be understood that the first transistor and the second transistor of the display panel of the embodiment of the present disclosure may be transistors in a display region of the display panel or may be transistors in a non-display region of the display panel. By way of example, FIG. 6 is a schematic diagram of a display panel according to another embodiment of the present disclosure. Referring to FIG. 6, the display panel includes a display region AA and a non-display region NAA. The non-display region NAA is located on at least one side of the display region AA. FIG. 6 illustrates that the non-display region NAA is located on a side of the display region AA. A driving circuit 60 is located in the non-display region NAA and a driving signal is provided for a pixel circuit (not shown in FIG. 6) in the display region AA through the driving circuit 60, so that the pixel circuit drives a light-emitting element located at the same sub-pixel to emit light so as to enable the display panel to display.

Figure 7:
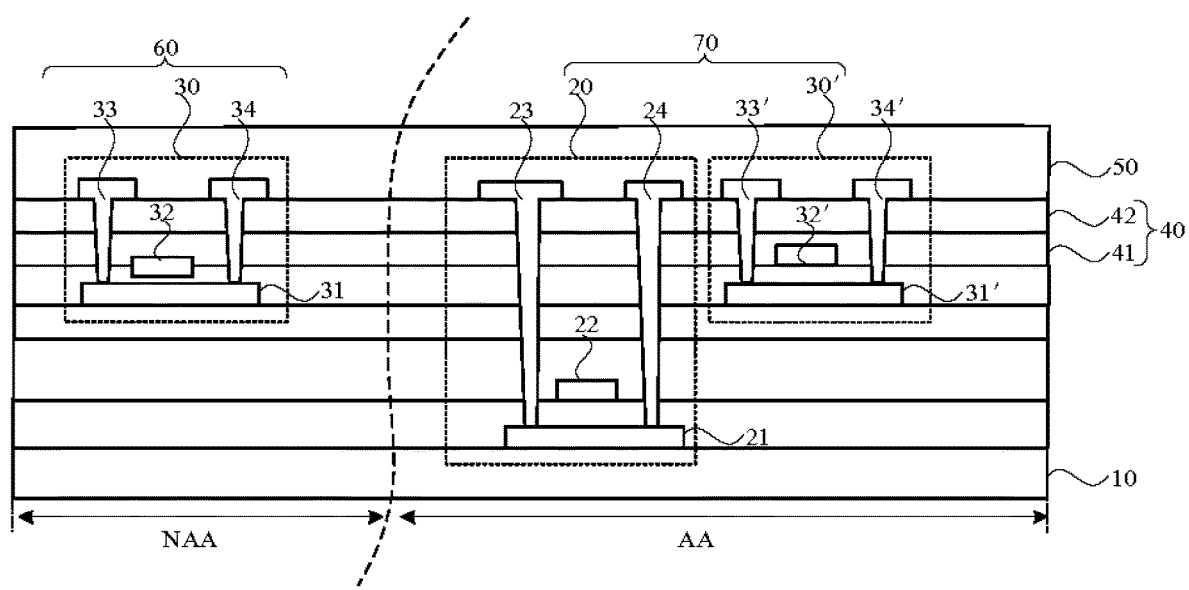
FIG. 7 is a schematic diagram of a display panel according to another embodiment of the present disclosure.

FIG. 7 is a schematic diagram of a display panel according to another embodiment of the present disclosure. Referring to FIG. 7, the display panel includes a display region AA and a non-display region NAA. A driving circuit 60 is located in the non-display region NAA, and a pixel circuit 70 is located in the display region AA. The driving circuit 60 includes the second transistor 30, and the pixel circuit 70 includes the first transistor 20 and the second transistor 30'. An active layer 31 of the second transistor 30 and an active layer 31' of the second transistor 30' each include an oxide semiconductor, such as an IGZO active layer. An oxide semiconductor thin-film transistor has a small leakage current so that a small leakage current of the pixel circuit 70 in a working process can be ensured. The first active layer 21 of the first transistor 20 includes silicon. Optionally, the silicon is an polysilicon, that is, the first active layer 21 is a polysilicon active layer, such as an LTPS active layer. As an LIPS thin-film transistor has the advantages of high carrier mobility, fast response, and low power consumption, when the pixel circuit 70 includes the first transistor 20 and the second transistor 30', the pixel circuit 70 can have all of the advantages of the two: high carrier mobility, fast response, low power consumption and small leakage current, which ensures the good performance of the pixel circuit 70 and enhances the display performance of the display panel. In addition, in the present embodiment, the second transistor 30 in the driving circuit 60 is disposed to be an oxide semiconductor transistor, and the second transistor 30' in the pixel circuit 70 is disposed to be an oxide semiconductor transistor at the same time. In this manner, the good performance of the driving circuit 60 and the pixel circuit 70 can be ensured and the display performance of the display panel can be further enhanced.

The first insulating layer 40 including the first insulating sublayer 41 and the second insulating sublayer 42 schematically shown in FIGS. 6 to 7 is only for illustration. In practice, the similar structure in FIGS. 1 to 5 may be adopted.

Figure 8:
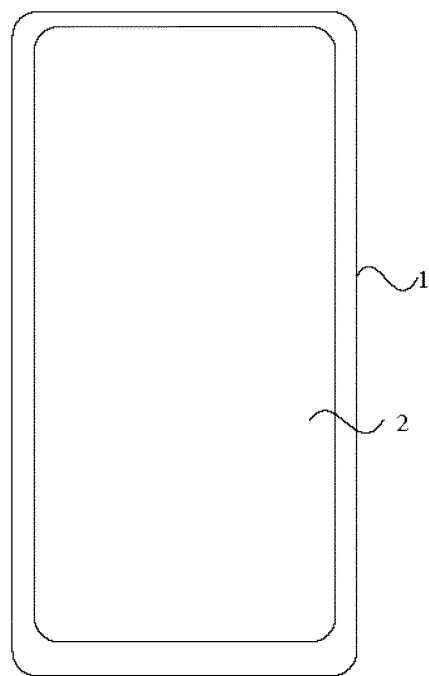
FIG. 8 is a schematic diagram of a display device according to an embodiment of the present disclosure.

FIG. 8 is a schematic diagram of a display device according to an embodiment of the present disclosure. Referring to FIG. 8, the display device 1 includes any one of the display panels 2 according to the embodiments of the present disclosure. The display device 1 may be a mobile phone, a computer, an intelligent wearable device or any other device.

It is to be noted that the preceding are merely preferred embodiments of the present disclosure and the principles used therein. It will be understood by those skilled in the art that the present disclosure is not limited to the embodiments described herein. Those skilled in the art can make various apparent modifications, adaptations, combinations and substitutions without departing from the scope of the present disclosure. Therefore, while the present disclosure has been described in detail through the preceding embodiments, the present disclosure is not limited to the preceding embodiments and may include more other equivalent embodiments without departing from the concept of the present disclosure. The scope of the present disclosure is determined by the scope of the appended claims.

What is claimed is:

1. A display panel, comprising:
   a base substrate;
   a first transistor and a second transistor that are formed on the base substrate, wherein the first transistor comprises a first active layer, a first gate, a first source and a first drain, and the first active layer comprises silicon; and wherein the second transistor comprises a second active layer, a second gate, a second source and a second drain, the second active layer comprises an oxide semiconductor, and the second gate is located on a side of the second active layer facing away from the base substrate;
   a first insulating layer, wherein the first insulating layer is located on a side of the second gate facing away from the base substrate, and the first insulating layer comprises an inorganic material; and
   a planarization layer, wherein the planarization layer is located on a side of the first insulating layer facing away from the base substrate, and the planarization layer comprises an organic material,
   wherein the first insulating layer comprises a first insulating sublayer and a second insulating sublayer, the second insulating sublayer is located on a side of the first insulating sublayer facing away from the base substrate, and a second compactness of the second insulating sublayer is greater than a first compactness of the first insulating sublayer; and
   wherein the display panel further comprises a third insulating sublayer, wherein the third insulating sublayer is located on a side of the first insulating sublayer facing away from the base substrate.

2. The display panel of claim 1, wherein
   a first material of the first insulating sublayer comprises $SiO_{x1}$, and a second material of the second insulating sublayer comprises $SiN_{y11}$, wherein x1 denotes a ratio of a number of oxygen atoms in the first insulating sublayer to a number of silicon atoms in the first insulating sublayer, and y11 denotes a ratio of a number of nitrogen atoms in the second insulating sublayer to a number of silicon atoms in the second insulating sublayer; and
   $$x1>y11.$$

3. The display panel of claim 1, wherein
   a first material of the first insulating sublayer comprises $SiO_{x1}$, and a second material of the second insulating sublayer comprises $MO_{a11}$, x1 denotes a ratio of a number of oxygen atoms in the first insulating sublayer to a number of silicon atoms in the first insulating sublayer, and a11 denotes a ratio of a number of oxygen atoms in the second insulating sublayer to a number of M atoms in the second insulating sublayer; and
   M is one of Al, Zr, Ti, Ta, Y, Nb, Mg or Ce.

4. The display panel of claim 1, wherein
   a first thickness of the first insulating sublayer is greater than a second thickness of the second insulating sublayer.

5. A display device, comprising a display panel of claim 1.

6. The display device of claim 5, wherein
   a first material of the first insulating sublayer comprises $SiO_{x1}$, and a second material of the second insulating sublayer comprises $SiN_{y11}$, wherein x1 denotes a ratio of a number of oxygen atoms in the first insulating sublayer to a number of silicon atoms in the first insulating sublayer, and y11 denotes a ratio of a number of nitrogen atoms in the second insulating sublayer to a number of silicon atoms in the second insulating sublayer; and
   $$x1>y11.$$

7. The display panel of claim 1, wherein
   a third compactness of the third insulating sublayer is greater than the first compactness of the first insulating sublayer; and
   the third compactness of the third insulating sublayer is greater than the second compactness of the second insulating sublayer.

8. The display panel of claim 7, wherein
   a first material of the first insulating sublayer comprises $SiO_{x1}$, a second material of the second insulating sublayer comprises $SiN_{y21}$, and a third material of the third insulating sublayer comprises $SiO_{x22}N_{y22}$;
   x1 denotes a ratio of a number of oxygen atoms in the first insulating sublayer to a number of silicon atoms in the first insulating sublayer, y21 denotes a ratio of a number of nitrogen atoms in the second insulating sublayer to a number of silicon atoms in the second insulating sublayer, x22 denotes a ratio of a number of oxygen atoms in the third insulating sublayer to a number of silicon atoms in the third insulating sublayer, and y22 denotes a ratio of a number of nitrogen atoms in the third insulating sublayer to the number of silicon atoms in the third insulating sublayer; and
   at least one of $x1>x22+y22$ and $x22+y22 \geq y21$ is satisfied.

9. The display panel of claim 7, wherein
a first material of the first insulating sublayer comprises SiO$_{x1}$, a second material of the second insulating sublayer comprises SiN$_{y21}$, and a third material of the third insulating sublayer comprises MO$_{a21}$; and
M is one of Al, Zr, Ti, Ta, Y, Nb, Mg or Ce.

10. The display panel of claim 7, wherein
the third insulating sublayer is located between the first insulating sublayer and the second insulating sublayer.

11. The display panel of claim 7, wherein
a third thickness of the third insulating sublayer is less than a first thickness of the first insulating sublayer and is less than a second thickness of the second insulating sublayer.

12. A display panel, comprising:
a base substrate;
a first transistor and a second transistor that are formed on the base substrate, wherein the first transistor comprises a first active layer, a first gate, a first source and a first drain, and the first active layer comprises silicon; and wherein the second transistor comprises a second active layer, a second gate, a second source and a second drain, the second active layer comprises an oxide semiconductor, and the second gate is located on a side of the second active layer facing away from the base substrate;
a first insulating layer, wherein the first insulating layer is located on a side of the second gate facing away from the base substrate, and the first insulating layer comprises an inorganic material; and
a planarization layer, wherein the planarization layer is located on a side of the first insulating layer facing away from the base substrate, and the planarization layer comprises an organic material,
wherein the first insulating layer comprises a first insulating sublayer and a second insulating sublayer, the second insulating sublayer is located on a side of the first insulating sublayer facing away from the base substrate, and a second compactness of the second insulating sublayer is greater than a first compactness of the first insulating sublayer; and
wherein a second material of the second insulating sublayer comprises SiO$_{x12}$N$_{y12}$.

13. The display panel of claim 12, wherein
a first material of the first insulating sublayer comprises SiOx1, wherein x1 denotes a ratio of a number of oxygen atoms in the first insulating sublayer to a number of silicon atoms in the first insulating sublayer, x12 denotes a ratio of a number of oxygen atoms in the second insulating sublayer to a number of silicon atoms in the second insulating sublayer, and y12 denotes a ratio of a number of nitrogen atoms in the second insulating sublayer to the number of silicon atoms in the second insulating sublayer;

$x1 > x12 + y12$; and the first insulating sublayer contacts the second insulating sublayer, and a concentration of oxygen atoms on a side of the second insulating sublayer facing the first insulating sublayer is greater than a concentration of oxygen atoms on a side of the second insulating sublayer facing away from the first insulating sublayer.

14. A display panel, comprising:
a base substrate;
a first transistor and a second transistor that are formed on the base substrate, wherein the first transistor comprises a first active layer, a first gate, a first source and a first drain, and the first active layer comprises silicon; and wherein the second transistor comprises a second active layer, a second gate, a second source and a second drain, the second active layer comprises an oxide semiconductor, and the second gate is located on a side of the second active layer facing away from the base substrate;
a first insulating layer, wherein the first insulating layer is located on a side of the second gate facing away from the base substrate, and the first insulating layer comprises an inorganic material; and
a planarization layer, wherein the planarization layer is located on a side of the first insulating layer facing away from the base substrate, and the planarization layer comprises an organic material,
wherein the first insulating layer comprises a first insulating sublayer and a second insulating sublayer, the second insulating sublayer is located on a side of the first insulating sublayer facing away from the base substrate, and a second compactness of the second insulating sublayer is greater than a first compactness of the first insulating sublayer;
wherein the display panel further comprises a fourth insulating sublayer;
wherein the fourth insulating sublayer is located on a side of the second insulating sublayer facing away from the base substrate;
wherein the fourth insulating sublayer comprises a same type of material as at least one of the first insulating sublayer or the second insulating sublayer; and
wherein of the first insulating sublayer and the second insulating sublayer, one insulating sublayer comprising the same type of material as the fourth insulating sublayer and having a same atomic ratio as the fourth insulating sublayer is not in contact with the fourth insulating sublayer.

15. The display panel of claim 14, wherein
of the first insulating sublayer and the second insulating sublayer, one insulating sublayer comprising the same type of material as the fourth insulating sublayer and having a different atomic ratio from the fourth insulating sublayer is in contact with the fourth insulating sublayer or is separated from the fourth insulating sublayer by another layer.

16. The display panel of claim 15, wherein
a first material of the first insulating sublayer comprises SiO$_{x1}$, and a fourth material of the fourth insulating sublayer comprises SiO$_{x14}$;
x1 denotes a ratio of a number of oxygen atoms in the first insulating sublayer to a number of silicon atoms in the first insulating sublayer, and x14 denotes a ratio of a number of oxygen atoms in the fourth insulating sublayer to a number of silicon atoms in the fourth insulating sublayer; and $x1 \geq x14$.

17. The display panel of claim 15, wherein
a first material of the first insulating sublayer comprises SiO$_{x1}$, a second material of the second insulating sublayer comprises SiN$_{y11}$, and a fourth material of the fourth insulating sublayer comprises SiN$_{y14}$;
x1 denotes a ratio of a number of oxygen atoms in the first insulating sublayer to a number of silicon atoms in the first insulating sublayer, y11 denotes a ratio of a number of nitrogen atoms in the second insulating sublayer to a number of silicon atoms in the second insulating sublayer, and y14 denotes a ratio of a number of nitrogen atoms in the fourth insulating sublayer to a number of silicon atoms in the fourth insulating sublayer; and $y11 \leq y14$.

18. The display panel of claim 15, wherein
a first material of the first insulating sublayer comprises $SiO_{x1}$, a second material of the second insulating sublayer comprises $MO_{a11}$, and a fourth material of the fourth insulating sublayer comprises $MO_{a12}$;
x1 denotes a ratio of a number of oxygen atoms in the first insulating sublayer to a number of silicon atoms in the first insulating sublayer, a11 denotes a ratio of a number of oxygen atoms in the second insulating sublayer to a number of M atoms in the second insulating sublayer, a12 denotes a ratio of a number of oxygen atoms in the fourth insulating sublayer to a number of M atoms in the fourth insulating sublayer, and M is one of Al, Zr, Ti, Ta, Y, Nb, Mg or Ce; and $a11 \geq a12$.

19. The display panel of claim 15, wherein
a first material of the first insulating sublayer comprises $SiO_{x1}$, a second material of the second insulating sublayer comprises $SiO_{x12}N_{y12}$, and a fourth material of the fourth insulating sublayer comprises $SiO_{x24}N_{y24}$;
x1 denotes a ratio of a number of oxygen atoms in the first insulating sublayer to a number of silicon atoms in the first insulating sublayer, x12 denotes a ratio of a number of oxygen atoms in the second insulating sublayer to a number of silicon atoms in the second insulating sublayer, y12 denotes a ratio of a number of nitrogen atoms in the second insulating sublayer to the number of silicon atoms in the second insulating sublayer, x24 denotes a ratio of a number of oxygen atoms in the fourth insulating sublayer to a number of silicon atoms in the fourth insulating sublayer, and y24 denotes a ratio of a number of nitrogen atoms in the fourth insulating sublayer to the number of silicon atoms in the fourth insulating sublayer; and $x12 \geq x24$.

20. The display panel of claim 19, wherein $y12 \leq y24$.

* * * * *